(12) United States Patent
Moriwaki (10) Patent No.: US 11,366,366 B2
(45) Date of Patent: Jun. 21, 2022

(54) ACTIVE MATRIX SUBSTRATE AND PHOTOELECTRIC IMAGING PANEL WITH THE SAME

(71) Applicant: SHARP KABUSHIKI KAISHA, Sakai (JP)

(72) Inventor: Hiroyuki Moriwaki, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 75 days.

(21) Appl. No.: 16/786,380

(22) Filed: Feb. 10, 2020

(65) Prior Publication Data

US 2020/0257177 A1    Aug. 13, 2020

Related U.S. Application Data

(60) Provisional application No. 62/804,763, filed on Feb. 13, 2019.

(51) Int. Cl.
| | | |
|---|---|---|
| *G02F 1/1362* | (2006.01) | |
| *H01L 27/146* | (2006.01) | |
| *H01L 27/12* | (2006.01) | |

(52) U.S. Cl.
CPC ...... *G02F 1/136286* (2013.01); *H01L 27/124* (2013.01); *H01L 27/1222* (2013.01); *H01L 27/14658* (2013.01)

(58) Field of Classification Search
CPC .......... G02F 1/136286; G02F 2203/58; G02F 2201/58; G02F 1/13318; G02F 1/13306; H01L 27/14658; H01L 27/124; H01L 27/1222; H01L 27/1214; H01L 27/0296; H01L 27/14616; H01L 27/14612; H01L 27/14663
See application file for complete search history.

(56) References Cited

U.S. PATENT DOCUMENTS

| | | | | |
|---|---|---|---|---|
| 5,606,340 A * | 2/1997 | Suzuki | ................ | G09G 3/3688 345/87 |
| 6,333,769 B1 * | 12/2001 | Suzuki | .............. | G02F 1/136204 349/40 |
| 8,941,696 B2 * | 1/2015 | Choi | ...................... | G09G 3/006 345/87 |

(Continued)

FOREIGN PATENT DOCUMENTS

| | | |
|---|---|---|
| JP | H10-010493 A | 1/1998 |
| JP | 2009-290171 A | 12/2009 |

*Primary Examiner* — Benyam Ketema (74) *Attorney, Agent, or Firm* — ScienBiziP, P.C.

(57) ABSTRACT

The active matrix substrate includes gate lines, data lines, photoelectric conversion elements provided in pixels bounded by the gate lines and the data lines and electrically connected to the data lines, and a bias line that is connected to the photoelectric conversion elements and supplies a bias voltage to the photoelectric conversion elements. The active matrix substrate also includes first protection circuits connected to the data lines, second protection circuits connected to the gate lines, and third protection circuits connected to the bias line. Each of the first protection circuits, second protection circuits, and third protection circuits includes at least one nonlinear element. A nonlinear element in each first protection circuit has a higher resistance than a nonlinear element in at least one of each second protection circuit and each third protection circuit.

11 Claims, 6 Drawing Sheets

(56) References Cited

U.S. PATENT DOCUMENTS

| | | | |
|---|---|---|---|
| 9,070,335 B2* | 6/2015 | Nakayasu | G09G 3/3648 |
| 10,510,745 B2* | 12/2019 | Cheng | H01L 27/0296 |
| 11,139,651 B2* | 10/2021 | Moriwaki | H02H 9/046 |
| 2006/0152470 A1* | 7/2006 | Kim | G09G 3/3655 |
| | | | 345/102 |
| 2007/0268637 A1* | 11/2007 | Hsu | H01L 27/0251 |
| | | | 361/56 |
| 2009/0302202 A1* | 12/2009 | Sato | H01L 27/14609 |
| | | | 250/208.1 |
| 2018/0374422 A1* | 12/2018 | Fujikawa | G02F 1/13452 |
| 2019/0096876 A1* | 3/2019 | Moriwaki | H01L 27/0296 |
| 2020/0057169 A1* | 2/2020 | Nakano | H01L 27/14623 |

* cited by examiner

ACTIVE MATRIX SUBSTRATE AND PHOTOELECTRIC IMAGING PANEL WITH THE SAME

TECHNICAL FIELD

The present disclosure relates to an active matrix substrate and a photoelectric imaging panel provided with the active matrix substrate.

BACKGROUND ART

Conventionally, techniques have been proposed in which a protection circuit for electrostatic protection of elements on an active matrix substrate is provided on the active matrix substrate. For example, JP 2009-290171 A discloses a solid-state image pickup device configured such that an electrostatic protection circuit is connected to a data line on an active matrix substrate. This electrostatic protection circuit has a nonlinear element that is connected in a reverse-biased state between a data line and a bias line and a nonlinear element that in connected in a reverse-biased state between the data line and a high-potential line to which an electric potential higher than that of the data line is applied. In this solid-state imaging device, the nonlinear elements, which are connected to the data line, in the electrostatic protection circuit are in the reverse-biased state. Accordingly, a leakage current to the data line is reduced.

Also, for example, JP 10(1998)-10493 A discloses a liquid crystal display device including an active matrix substrate with protection against static electricity. The active matrix substrate of this liquid crystal display device is provided with two ring-shaped common lines surrounding the outer periphery of a display region. One of the common lines is arranged outward from the other common line, and the two common lines are short-circuited. Also, two protection circuits connected to the two common lines, respectively, are connected to both end portions of a gate line and a data line provided on the active matrix substrate. These two protection circuits each include a bidirectional diode obtained by combining a forward diode and a reverse diode. That is, two bidirectional diodes connected to the common lines different from each other are connected to both end portions of each of one gate line and one data line. In this active matrix substrate, since the common lines are provided in duplicate, electric potential bias caused inside liquid crystal display elements owing to static electricity is less likely to occur.

By the way, imaging panels, which are configured to accumulate charges corresponding to the amounts of received X-rays in pixels, read out the minute charges accumulated in the pixels as currents. Accordingly, during imaging, if leakage currents of nonlinear elements in protection circuits connected to data lines flow into the data lines, a proper imaging result cannot be obtained. Therefore, in particular, leakage currents of the protection circuits connected to the data lines need to be suppressed.

SUMMARY

An active matrix substrate developed in light of the above-described problem is an active matrix substrate including: gate lines; data lines that cross the gate lines; a photoelectric conversion element provided in a pixel bounded by the gate lines and the data lines, the photoelectric conversion element being electrically connected to a corresponding one of the data lines; a bias line that is connected to the photoelectric conversion element and supplies a bias voltage to the photoelectric conversion element; a first protection circuit connected to the data lines; a second protection circuit connected to the gate lines; and a third protection circuit connected to the bias line, wherein the first protection circuit, the second protection circuit, and the third protection circuit each include at least one nonlinear element, and a nonlinear element in the first protection circuit has a higher resistance than a nonlinear element in at least one of the second protection circuit and the third protection circuit.

According to the above-described configuration, in the active matrix substrate provided with the photoelectric conversion element, a leakage current from the protection circuit connected to the data lines is less likely to flow into the data lines.

DETAILED DESCRIPTION OF THE INVENTION

Embodiments of the present invention will be described below with reference to the drawings. Components that are identical or equivalent to each other in the drawings are given the same reference numerals, and descriptions thereof are not repeated.

First Embodiment (Configuration)

Figure 1:
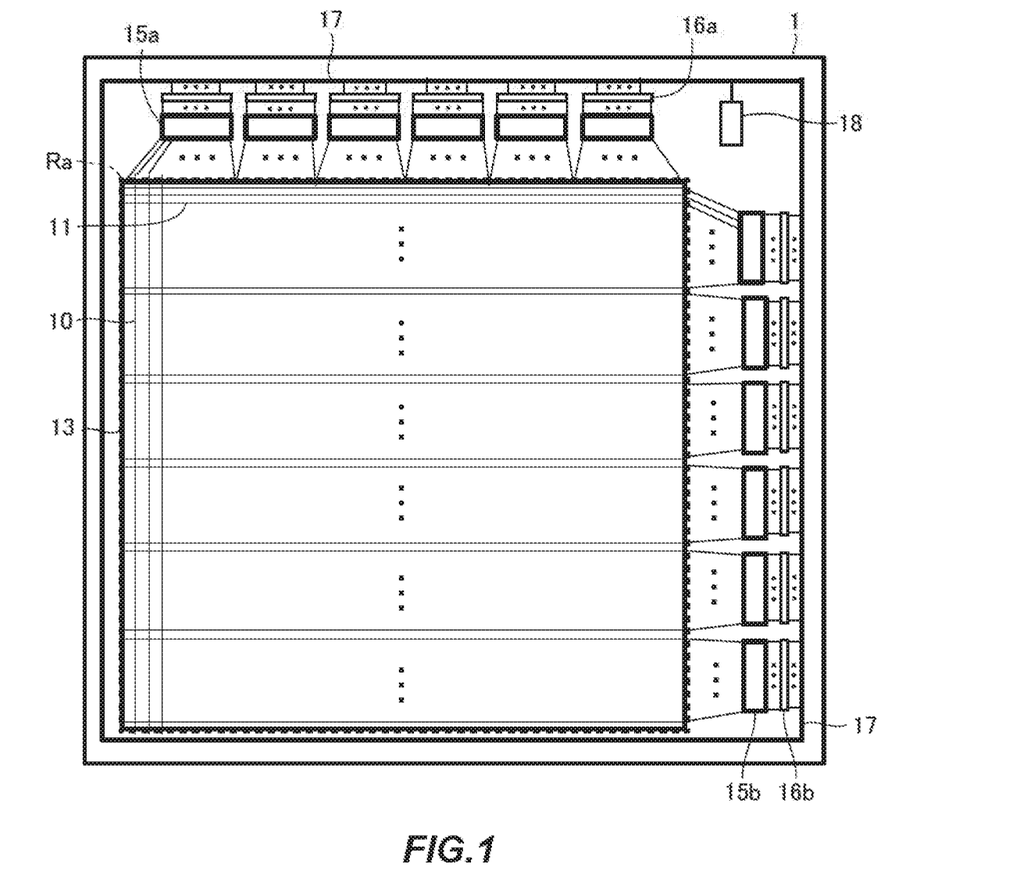
FIG. 1 is a plan view showing a schematic configuration of an active matrix substrate in a first embodiment.

FIG. 1 is a plan view showing a schematic configuration of an active matrix substrate in the present embodiment. An active matrix substrate 1 is used in, for example, a photoelectric X-ray imaging panel. That is, a photoelectric imaging panel can be produced by providing a scintillator for converting X-rays that have passed through a subject to fluorescence (scintillation light) on one surface side of the active matrix substrate 1. The configuration of the active matrix substrate 1 will be described specifically below.

The active matrix substrate 1 has a plurality of data lines 10 and a plurality of gate lines 11 that cross the plurality of data lines 10. The active matrix substrate 1 has an imaging region Ra in which a plurality of regions (referred to as "pixels" hereinafter) surrounded by the data lines 10 and the gate lines 11 are arranged.

Inside the imaging region Ra, a bias line 13 is arranged so as to surround the imaging region Ra. Although not shown in FIG. 1, each pixel is provided with bias lines branched from the bias line 13 (referred to as "branch bias lines" hereinafter).

Outside the imaging region Ra, terminal sections 15a, terminal sections 15b, protection circuit sections 16a, and protection circuit sections 16b are provided, and also, a common line 17 and a common terminal 18 are arranged.

As shown in FIG. 1, outside the imaging region Ra, the common line 17 is formed in a rectangular shape so as to extend along the outer edge of the active matrix substrate 1.

The terminal sections 15a are respectively connected to some of the data lines 10 out of all the data lines 10. Each of the protection circuit sections 16a is connected to a corresponding one of terminal sections 15a. The terminal sections 15b are respectively connected to some of the gate lines 11 out of all the gate lines 11. Each of the protection circuit sections 16a is connected to a corresponding one of the terminal sections 15b. The common terminal 18, the protection circuit sections 16a, and the protection circuit sections 16b are each connected to the common line 17. These components each will be described in detail below.

Figure 2:
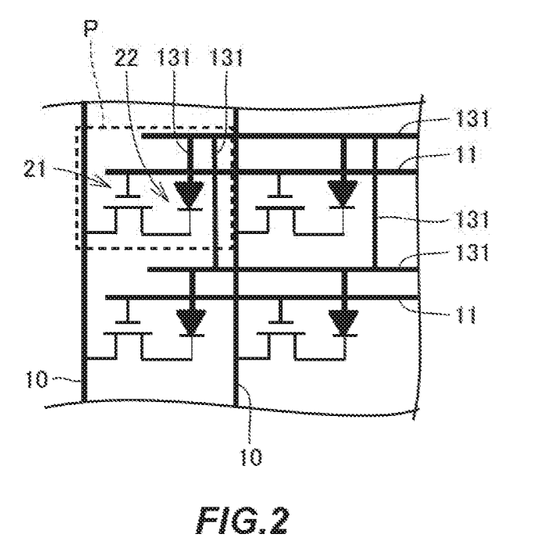
FIG. 2 is an equivalent circuit diagram of pixels on the active matrix substrate shown in FIG. 1.

The configuration of a pixel in the imaging region Ra will now be described. FIG. 2 is an equivalent circuit diagram showing the configuration of pixels. As shown in FIG. 2, a pixel P has a thin film transistor (TFT) 21 and a photoelectric conversion element 22.

The photoelectric conversion element 22 includes a PIN photodiode and a pair of electrodes (cathode electrode, anode electrode). A source of the TFT 21 is connected to a data line 10, and a drain of the TFT 21 is connected to the cathode electrode of the photoelectric conversion element 22. The anode electrode of the photoelectric conversion element 22 is connected to a branch bias line 131.

In the present embodiment, in pixels, branch bias lines 131 are provided in a slit shape. The branch bias line 131 is connected to the anode electrode of the photoelectric conversion element 22 via an interlayer insulating film, which is not shown. In order to secure a large light receiving area, the anode electrode of the photoelectric conversion element 22 is provided in proximity to the data line 10 in the pixel when viewed in plan view. The branch bias line 131 and the anode electrode of the photoelectric conversion element 22 are provided on a layer that is different from a layer on which the data line 10 is provided, and an interlayer insulating film (not shown) is provided between the anode electrode and the data line 10. A capacitance is formed between the data line 10 and an end portion of the anode electrode of the photoelectric conversion element 22 closest to the data line 10 via the interlayer insulating film (not shown). Accordingly, the end portion of the anode electrode of the photoelectric conversion element 22 and the data line 10 are coupled to each other via the capacitance.

Although not shown in FIG. 1 etc., to the active matrix substrate 1, a driving circuit for scanning the gate lines 11 by applying a scanning voltage and a readout circuit for reading out charges obtained through conversion by the PIN photodiodes from the data lines 10 are connected. When the TFT 21 connected to a scanned gate line 11 is turned ON, an electrical signal corresponding to the charge obtained through conversion by the photoelectric conversion element 22 is output to the readout circuit through the data line 10.

Next, the configurations of the terminal sections 15a and 15b, the protection circuit sections 16a and 16b, the common line 17, and the common terminal 18 in the present embodiment will be described.

Figure 3A:
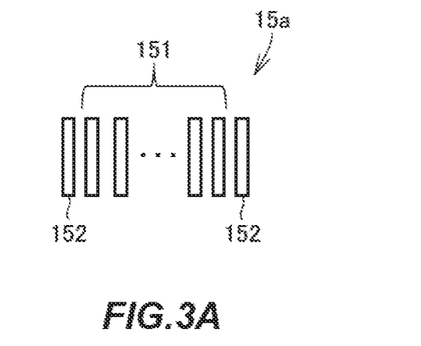
FIG. 3A is a schematic view showing an example of the arrangement of data terminals and bias terminals included in one terminal section shown in FIG. 1.
Figure 3B:
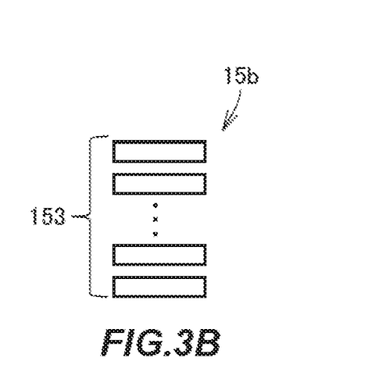
FIG. 3B is a schematic view showing an example of the arrangement of gate terminals included in one terminal section shown in FIG. 1.

FIGS. 3A and 3B are schematic views showing examples of the configurations of the terminal sections 15a and 15b, respectively. As shown in FIG. 3A, a terminal section 15a includes a plurality of data terminals 151 and two bias terminals 152 arranged with the plurality of data terminals 151 interposed therebetween. The data terminals 151 in each terminal section 15a are connected to data lines 10 that are different from data lines 10 to which data terminals 151 in other terminal sections 15a are connected. That is, the respective terminal sections 15a include data terminals 151 connected to, out of all the data lines 10, some data lines 10 that are different from each other.

As shown in FIG. 3B, each terminal section 15b includes a plurality of gate terminals 153. That is, the respective terminal sections 15b include gate terminals 153 connected to, out of all the gate lines 11, some gate lines 11 that are different from each other.

Figure 4A:
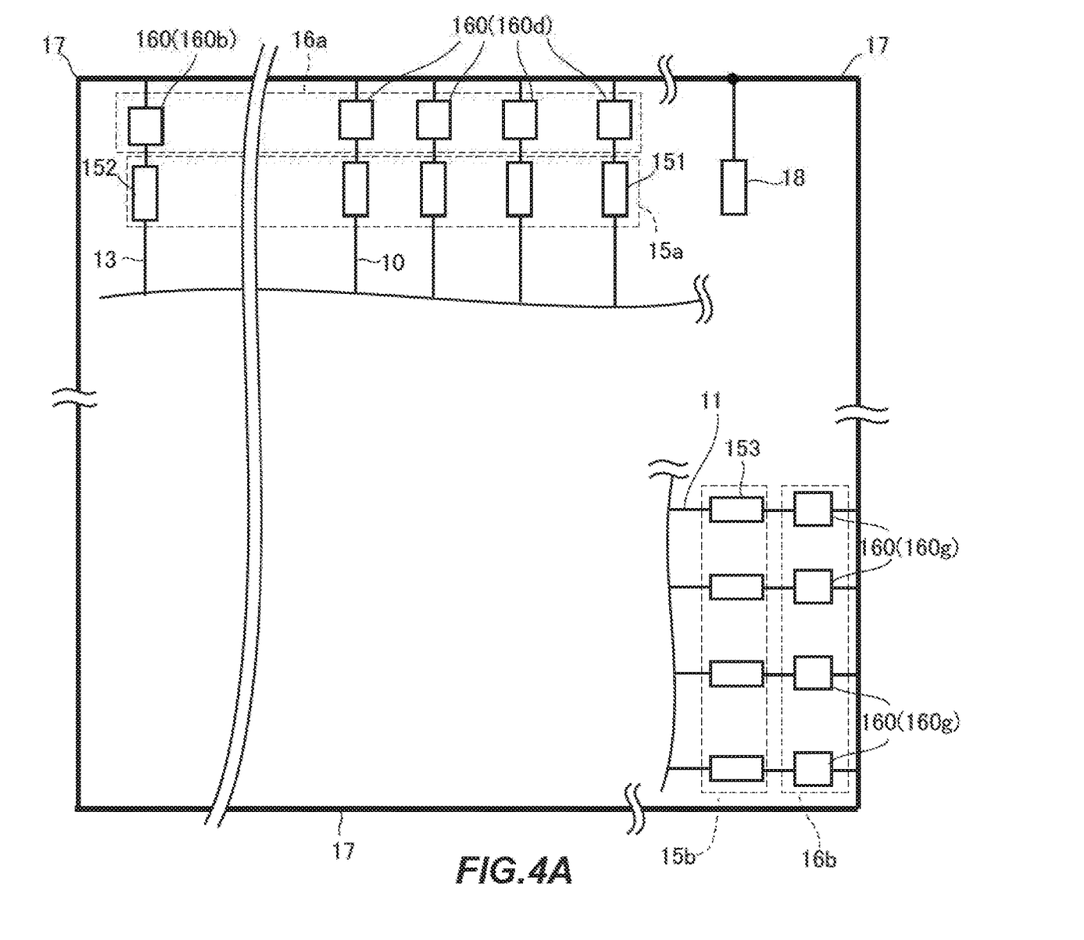
FIG. 4A is a plan view showing the configurations of protection circuit sections on the active matrix substrate shown in FIG. 1 and an example of connection between the protection circuit sections and a common line.

FIG. 4A is a plan view showing a simplified representation of some of the protection circuit sections 16a and 16b and the common line 17.

As shown in FIG. 4A, a protection circuit section 16a includes a plurality of protection circuits 160 (160d, 160b) connected in one-to-one correspondence to a plurality of data terminals 151 and bias terminals 152 included in a corresponding one of the terminal sections 15a. A protection circuit section 16b includes a plurality of protection circuits 160 (160g) connected in one-to-one correspondence to a plurality of gate terminals 153 included in a corresponding one of the terminal sections 15b.

In the present embodiment, a protection circuit 160d connected to a data terminal 151, a protection circuit 160b connected to a bias terminals 152, and a protection circuit 160g connected to a gate terminals 153 are simply referred to as a "protection circuit 160" when it is not necessary to distinguish them from each other.

Figure 4B:
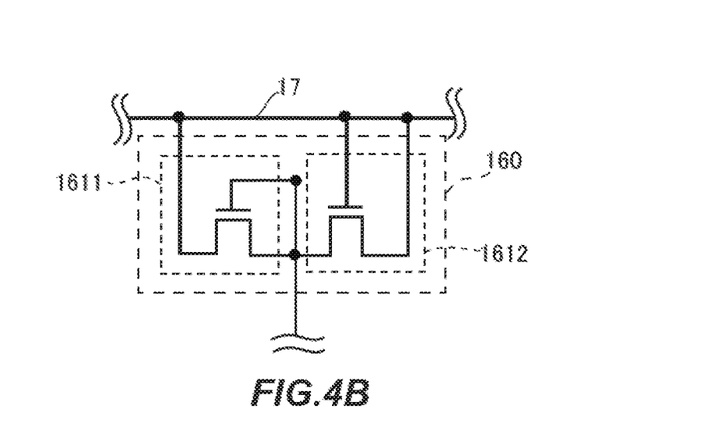
FIG. 4B is an equivalent circuit diagram of a protection circuit shown in FIG. 4A.

FIG. 4B is an equivalent circuit diagram showing an example of the configuration of one protection circuit 160. As shown in FIG. 4B, the protection circuit 160 includes, as nonlinear elements, thin film transistors (TFT) 1611 and 1612 of either an n-channel type or a p-channel type.

In the TFT 1611, a gate and a source are each connected to any one of the data terminal 151, the bias terminal 152, and the gate terminal 153, and a drain is connected to the common line 17. In the TFT 1612, a gate and a drain are each connected to the common line 17, and a source is connected to any one of the data terminal 151, the bias terminal 152, and the gate terminal 153. That is, in each of the TFTs 1611 and 1612, the gate and the source or drain are short-circuited, and the TFTs 1611 and 1612 are connected in parallel with each other.

In this example, the TFTs 1611 and 1612 in the respective protection circuits 160 have the same channel width (W), which is about 5 μm, for example. On the other hand, the channel length (L) of the TFTs 1611 and 1612 in the protection circuits 160d are different from that of the TFrs 1611 and 1612 in the other protection circuits 160g and 160b. Specifically, the channel length (L) of the TFTs 1611 and 1612 in the protection circuits 160d is, for example, about 6000 µm, whereas the channel length (L) of the TFTs 1611 and 1612 in the other protection circuits 160g and 160b are about 60 µm.

That is, the TFTs 1611 and 1612 in the protection circuits 160d have a longer channel length (L) than the TFTs 1611 and 1612 in the protection circuits 160g and 160b. Accordingly, the ratio (L/W) of the channel length (L) to the channel width (W) of the TFTs 1611 and 1612 in the protection circuits 160d is larger than the ratio (L/W) of the TFTs 1611 and 1612 in the protection circuits 160g and 160b, and the protection circuits 160d thus have a higher resistance than the protection circuits 160g and 160b. It is preferable that the TFTs 1611 and 1612 in the protection circuit 160d each have a source-drain current of 1 (nA) or less when the gate voltage is 0 V.

Referring back to FIG. 4A, to the gate lines 11, a scanning voltage (e.g., +20 V) for scanning the gate lines 11 or a non-scanning voltage (e.g., −10 V) is supplied from the outside of the active matrix substrate 1 during imaging.

To the data lines 10, a voltage of, e.g., approximately 1 V is supplied from the outside of the active matrix substrate 1 during imaging.

The bias line 13 is connected to the bias terminals 152. To the bias terminals 152, a predetermined bias voltage (e.g., −6 V) is supplied from the outside of the active matrix substrate 1 during imaging. The bias voltage is a voltage at which the photoelectric conversion elements 22 are reverse-biased.

The common line 17 is connected to the common terminal (GND terminal) 18. To the common terminal 18, a predetermined reference voltage (approximately 0 V) lower than the voltage applied to the data lines 10 during imaging is supplied from the outside of the active matrix substrate 1. In this example, the common line 17 is made of the same material as the gate lines 11.

During the production process etc. of the active matrix substrate 1, static electricity may enter the wiring lines such as the data lines 10, the gate lines 11, and the bias line 13 in the active matrix substrate 1. If positive static electricity enters the wiring lines when the predetermined reference voltage (0 V) is applied to the common line 17, in the case where the TFTs 1611 and 1612 in the protection circuit 160 are of an n-channel type, the p-n junction of the TFT 1611 is forward-biased whereas the p-n junction of the TFT 1612 is reverse-biased. As a result, a current flows between the source and the drain of the TFT 1611, whereby the static electricity can be released to the common line 17. On the other hand, if negative static electricity enters the wiring lines, the p-n junction of the TFT 1611 is reverse-biased whereas the p-n junction of the TFT 1612 is forward-biased. As a result, the negative static electricity can be canceled out by a positive charge from the common line 17.

During imaging, the predetermined reference voltage (0 V) is supplied to the common line 17 via the common terminal 18, and a voltage (about 1 V) is supplied to the data lines 10. At this time, in each of the protection circuits 160d, the p-n junction of the TFT 1611 is forward-biased and the p-n junction of the TFT 1612 is reverse-biased. As described above, the TFTs 1611 and 1612 in the protection circuits 160d have a higher resistance than the TFTs 1611 and 1612 in the other protection circuits 160. Accordingly, off-leakage currents of the TFTs 1612 in the protection circuits 160d are less likely to flow into the data lines 10, and this allows a proper imaging result to be obtained.

The above-described first embodiment describes an example where the channel length of the nonlinear elements (TFTs 1611 and 1612) in the protection circuits 160d is set to be longer than the channel length of the nonlinear elements in the protection circuits 160g and 160b so as to allow the protection circuits 160d to have a higher resistance than the other protection circuits 160g and 160b. It is to be noted, however, that the method for increasing the resistance of the nonlinear elements in the protection circuits 160d is not limited thereto. For example, the channel width of the TFTs 1611 and 1612 in the protection circuits 160d may be set to be narrower than that of the TFTs in the protection circuits 160g and 160b so as to allow the protection circuits 160d to have a higher resistance than the protection circuits 160g and 160b.

Furthermore, although the above description is directed to an example where the nonlinear elements in the protection circuits 160d have a higher resistance than the nonlinear elements in the protection circuits 160g and 160b, the nonlinear elements in the protection circuits 160d need only to have a higher resistance than the nonlinear elements in at least one of the protection circuits 160g and 160b.

Second Embodiment

The above-described first embodiment describes an example where all the protection circuits 160 are connected to the same common line 17. The present embodiment describes an example where protection circuits 160d are connected to a common line that is different from a common line to which other protection circuits 160b and 160g are connected.

Figure 5A:
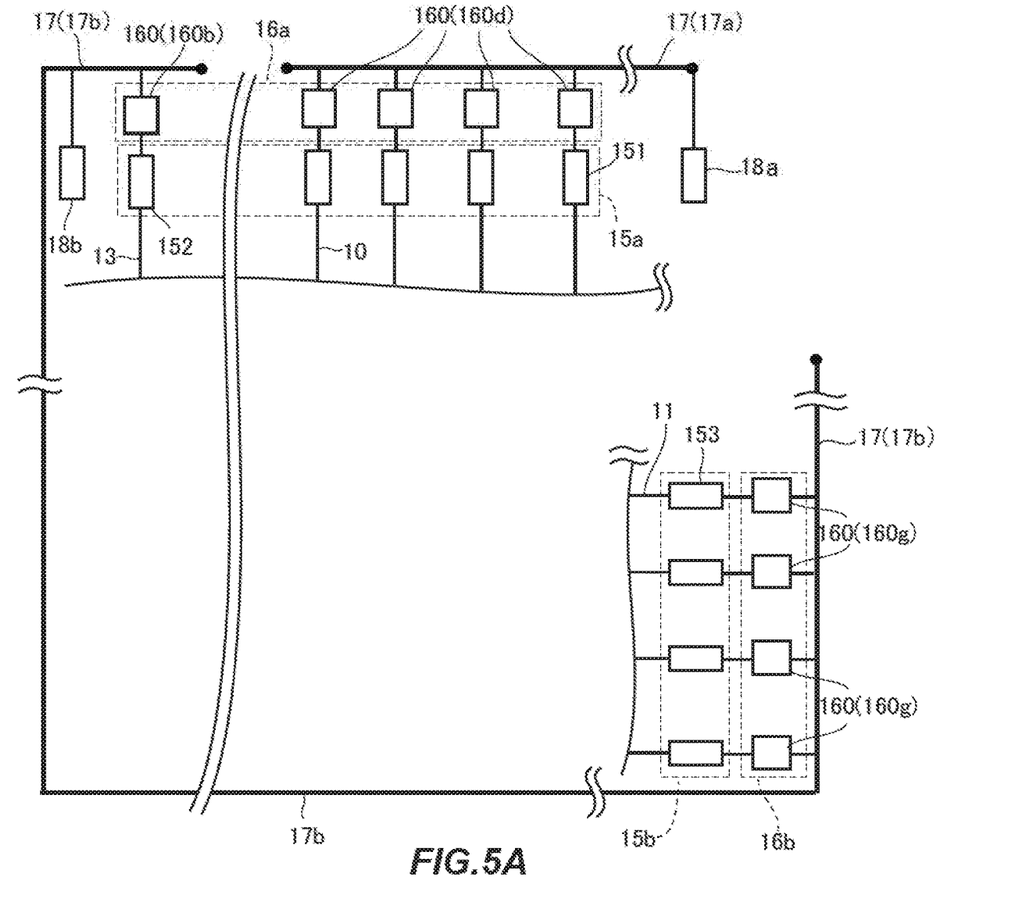
FIG. 5A is a plan view showing an example of connection between protection circuits and common lines in a second embodiment.

FIG. 5A is a plan view showing an example of the connection between protection circuits 160 and common lines 17 in the present embodiment. In FIG. 5A, the same components as those in the first embodiment are given the same reference numerals as used in the first embodiment. The following description is mainly directed to the configuration of the second embodiment different from that of the first embodiment.

As shown in FIG. 5A, in the present embodiment, a common line 17a and a common line 17b are provided on an active matrix substrate 1. The common lines 17a and 17b are separated and are not electrically connected to each other. Protection circuits 160d and a common terminal 18a are connected to the common line 17a, and protection circuits 160b and 160g and a common terminal 18b are connected to a common line 17b.

Similarly to the common terminal 18 in the above-described first embodiment, the common terminals 18a and 18b are also configured such that a predetermined reference voltage (about 0 V) is supplied thereto from the outside of the active matrix substrate 1.

Figure 5B:
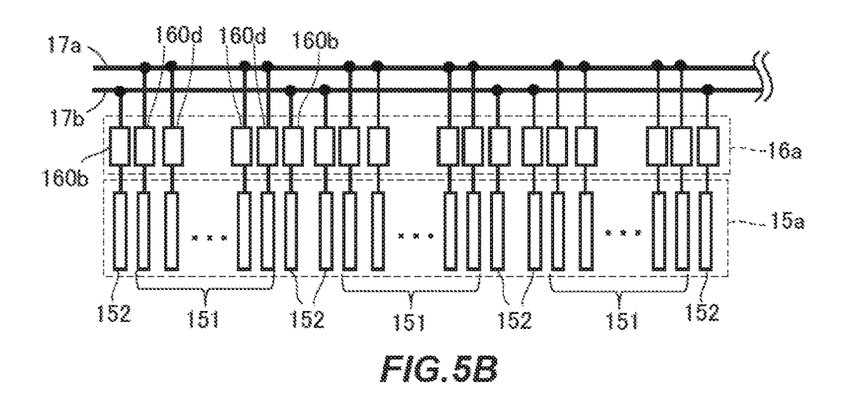
FIG. 5B is an enlarged schematic view of a connection portion between one of the protection circuit sections 16a shown in FIG. 5A and the common lines.

FIG. 5B is a schematic view showing an example of the connection between the protection circuits 160d and 160b in a protection circuit section 16a and the common lines 17a and 17b shown in FIG. 5A.

As shown in FIG. 5B, bias terminals 152 are arranged with a plurality of data terminals 151 interposed therebetween, and protection circuits 160b connected to the bias terminals 152 are arranged with a plurality of protection circuits 160d connected to the data terminals 151 interposed therebetween. Although FIG. 5B shows the common lines 17a and 17b in the same plane for the sake of convenience of illustration, they are actually arranged so as to overlap each other with via an interlayer insulating film (not shown).

In this example, the common line 17a is made of the same material as the gate lines 11, and the common line 17b is made of the same material as the bias line 13. Accordingly, the common line 17h and the bias line 13 are formed in the same layer, and the protection circuits 160g and the gate lines 11 are formed in the same layer. The protection circuits 160g are connected to the common line 17b through a contact hole provided in the interlayer insulating film, which is not shown. The materials of the common lines 17a and 17b are not limited to those described above, and may be any material as long as they are conductive.

When the common line 17a connected to the protection circuits 160d and the common line 17b connected to the protection circuits 160g and 160b are not electrically connected to each other as in the above-described second embodiment, leakage currents in the protection circuits 160g and 160b can be more effectively prevented from flowing into the data lines 10 through the common lines, as compared with the first embodiment. Therefore, it is possible to obtain a still more proper imaging result that in the first embodiment.

The above-described embodiments are merely illustrative examples of possible implementations. Therefore, the present invention is not limited to the above-described embodiments, and the above-described embodiments may be modified as appropriate without departing from the spirit and the scope of the present invention. Such modified examples of the present invention will be described below.

(1) In the above-described first and second embodiments, the TFTs 1611 and 1612 at least in the protection circuits 160d may be made using an oxide semiconductor containing indium (In), gallium (Ga), zinc (Zn), and oxygen (O). With this configuration, off-leakage currents of the TFTs 1611 and 1612 can be further reduced as compared with the case where amorphous silicon (a-Si) is used as the semiconductor of the TFTs 1611 and 1612. As a result, at the time of reading out charges accumulated in the pixels through the data lines 10, leakage currents of the protection circuits 160d are less likely to affect the readout, and this allows a more proper imaging result to be obtained.

(2) In the above-described first and second embodiments, the TFTs 1611 and 1612 at least in the protection circuits 160d may be TFTs of a p-channel type and an n-channel type, in which polycrystal low-temperature poly-silicon is used as a semiconductor. As compared with the case where amorphous silicon (a-Si) is used as the semiconductor, the threshold voltage of the TFTs can be increased by doping an impurity, whereby the resistance of the protection circuits 160d can be increased.

(3) In the above-described second embodiment, after a photoelectric imaging panel is produced using the active matrix substrate, the protection circuits 160d may be disconnected from all the data terminals 151 in the active matrix substrate 1. With this configuration, leakage currents of the protection circuits 160d can be reliably prevented from flowing into the data lines 10 during X-ray imaging in the photoelectric imaging panel, whereby the imaging accuracy can be further improved.

(4) The configuration of the protection circuits 160 in the above-described embodiments and modified examples are not limited thereto. In each protection circuit 160, diodes such as photodiodes may be used as the nonlinear elements. Each pixel in the active matrix substrate 1 is provided with a photodiode 22. Accordingly, by using photodiodes similar to the photodiodes 22 in the protection circuits 160, the protection circuits 160 can be produced in the step of forming the photodiodes 22 during the production process of the active matrix substrate 1.

Figure 6:
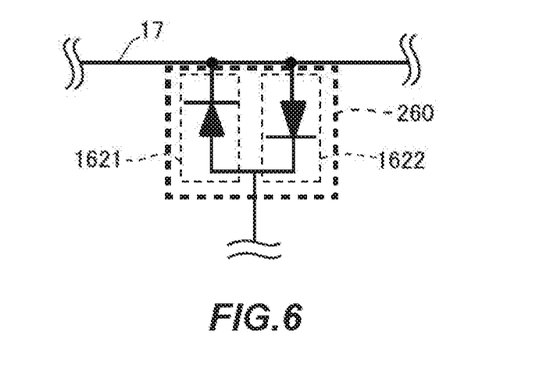
FIG. 6 is an equivalent circuit diagram of a protection circuit in a modified example (4).

FIG. 6 is an equivalent circuit diagram of a protection circuit constituted using diodes. As shown in FIG. 6, a protection circuit 260 in this example is constituted by connecting diodes 1621 and 1622 in parallel with each other. An anode of the diode 1621 and a cathode of the diode 1622 are connected to each other, and a cathode of the diode 1621 and an anode of the diode 1622 are connected to a common line 17. Hereinafter, a protection circuit 260 connected to a data terminal 151 is referred to as a protection circuit 260d, a protection circuit 260 connected to a bias terminal 152 is referred to as a protection circuit 260b, and a protection circuit 260 connected to a gate terminal 153 is referred to as a protection circuit 260g.

In this case, diodes used in the protection circuit 260d are configured so as to have a higher resistance than diodes used in the protection circuits 260b and 260g. Specifically, for example, such a configuration may be achieved by making the areas of the diodes in the protection circuit 260d smaller than those of the diodes in the protection circuits 260b and 260g or making the diodes in the protection circuit 260d thicker than the diodes in the protection circuits 260b and 260g. Alternatively, photodiodes may be used in the protection circuit 260d, and TFTs may be used in the protection circuits 260b and 260g.

During imaging, when a predetermined reference voltage (0 V) is applied to the common line 17 and a voltage (about 1 V) is applied to data lines 10, the diode 1621 is forward-biased whereas the diode 1622 is reverse-biased in the protection circuit 260d. Since the protection circuit 260d has a higher resistance than the other protection circuits, even if a leakage current of the diode 1621 is generated, the leakage current is less likely to flow into a data line 10.

Figure 7:
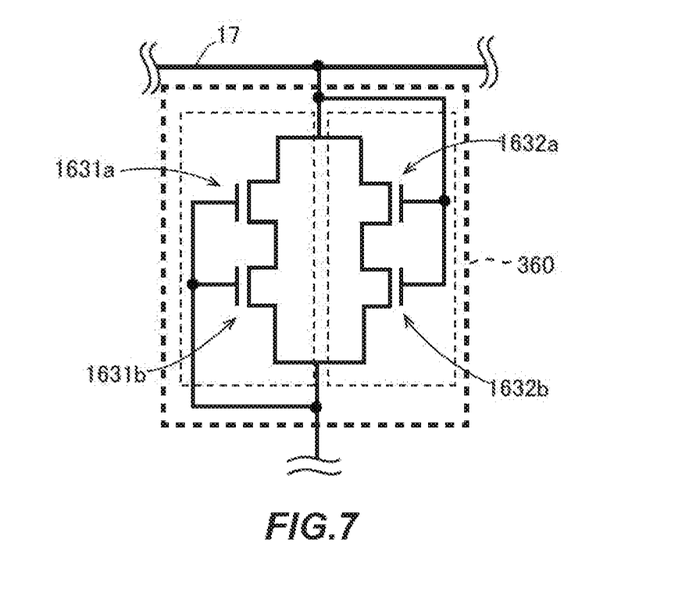
FIG. 7 is an equivalent circuit diagram of a protection circuit different from the protection circuit shown in FIG. 6.

Further, instead of the protection circuits 160 in the above-described embodiments, it is also possible to use protection circuits 360 each including four TFTs, namely, TFTs 1631a, 1631b, 1632a, and 1632b, as shown in FIG. 7.

As shown in FIG. 7, in the TFT 1631a, a gate is connected to a gate of the TFT 1631b, a source is connected to a drain of the TFT 1631b, and a drain is connected to the common line 17. Also, the gate and the source of the TFT 1632a are connected to the common line 17. In the TFT 1632b, the gate is connected to the gate of the TFT 1632a, a source is connected to the drain of the TFT 1632a, and the drain is connected to the source of the TFT 1631b. That is, in the protection circuit 360 in this example, the pair of TFTs 1631a and 1631b connected in series and the pair of TFTs 1632a and 1632b connected in series are connected in parallel with each other. In this case, depending on the electric potential of a wiring line (a data line 10, a gate line 11, or a bias line 13) connected to the protection circuit 360, the p-n junction of one of the pair of TFT 1631a and 1631b connected in series and the pair of TFT 1632a and 1632b connected in series is forward-biased whereas the p-n junction of the other one of the pairs is reverse-biased.

The TFTs of the protection circuit 360 connected to the data terminal 151 have a longer channel length (L) than the TFTs of the protection circuits 360 connected to the bias terminal 152 and the gate terminal 153, and thus have a higher resistance.

The structure of the protection circuits is not limited to the above-described structure using the four TFTs. Each protection circuit need only be constituted by a nonlinear element including one or more TFTs with a forward-biased p-n junction and a nonlinear element including one or more TFTs with a reverse-biased p-n junction.

Figure 8:
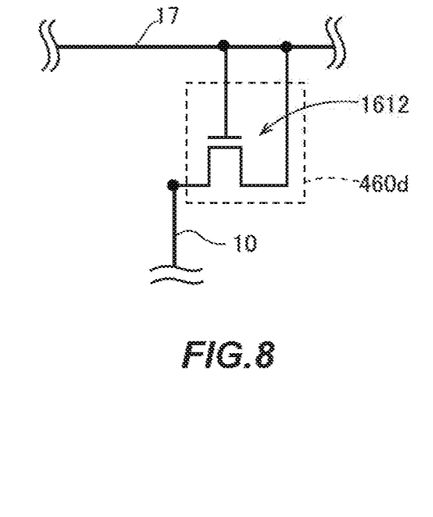
FIG. 8 is an equivalent circuit diagram of a protection circuit connected to a data line, out of protection circuits in a modified example (5).

(5) Although the above-described embodiments describe examples where each protection circuit 160 includes a pair of nonlinear elements connected in parallel with each other, protection circuits connected to the data lines 10 may each include only one nonlinear element. FIG. 8 is an equivalent circuit diagram showing the structure of a protection circuit connected to a data line 10 in the present modified example. As shown in FIG. 8, a protection circuit 460d connected to a data line 10 includes only a TFT 1612, which is the same as the TFT 1612 used in the above-described first embodiment. As in the first embodiment, the TFT 1612 in the protection circuit 460d has a higher resistance than TFTs in other protection circuits. When a voltage (about 1 V) is applied to the data line 10 and a predetermined reference voltage (0 V) is supplied to a common line 17 during imaging, the p-n junction of the TFT 1612 is reverse-biased. Since the TFT 1612 of the protection circuit 460d has a higher resistance than those in the other protection circuits, leakage currents are less likely to flow into the data line 10 via the TFT 1612. Accordingly, charges accumulated in a pixel can be read out properly through the data line 10.

In the present modified example, each protection circuit connected to a gate line 11 or a bias line 13 may include a pair of nonlinear elements as in the first embodiment. With this configuration, even if positive or negative static electricity is generated during the production process etc. of the active matrix substrate 1, the static electricity can be released to the common line 17 via one of the nonlinear elements in the protection circuit connected to the gate line 11 or the bias line 13 or can be canceled out by a positive charge from the common line 17.

(6) In the active matrix substrate according to any of the above-described embodiments and modified examples, a scintillator may be provided on a surface of the active matrix substrate on the side to be irradiated with X-rays. Furthermore, in a photoelectric X-ray imaging panel including the active matrix substrate 1 and the scintillator provided on the active matrix substrate 1, the driving circuit for scanning the gate lines 11 and the readout circuit for reading out charges corresponding to fluorescence obtained through conversion by the photoelectric conversion elements 22 through the data lines 10 may be connected to the active matrix substrate 1.

The above-described active matrix substrate and a photoelectric imaging panel using the same can be described as follows.

The active matrix substrate is an active matrix substrate including: gate lines; data lines that cross the gate lines; a photoelectric conversion element provided in a pixel bounded by the gate lines and the data lines, the photoelectric conversion element being electrically connected to a corresponding one of the data lines; a bias line that is connected to the photoelectric conversion element and supplies a bias voltage to the photoelectric conversion element; a first protection circuit connected to the data lines; a second protection circuit connected to the gate lines; and a third protection circuit connected to the bias line, wherein the first protection circuit, the second protection circuit, and the third protection circuit each include at least one nonlinear element, and a nonlinear element in the first protection circuit has a higher resistance than a nonlinear element in at least one of the second protection circuit and the third protection circuit (first configuration).

According to the first configuration, the active matrix substrate includes a photoelectric conversion element provided in a pixel bounded by the gate lines and the data lines, and the photoelectric conversion element is electrically connected to a corresponding one of the data lines and the bias line. Also, the active matrix substrate includes a first protection circuit connected to the data lines, a second protection circuit connected to the gate lines, and a third protection circuit connected to the bias line. The first protection circuit, the second protection circuit, and the third protection circuit each include at least one nonlinear element. A nonlinear element in the first protection circuit has a higher resistance than a nonlinear element in at least one of the second protection circuit and the third protection circuit. Therefore, leakage currents of the nonlinear element in the first protection circuit are less likely to flow into the data lines, and charges accumulated by the photoelectric conversion element thus can be read out properly through the data line.

In the first configuration, the at least one nonlinear element may include a thin film transistor, and a channel length of the thin film transistor in the first protection circuit may be longer than a channel length of the thin film transistor in at least one of the second protection circuit and the third protection circuit (second configuration).

According to the second configuration, the channel length of the thin film transistor in the first protection circuit is longer than the channel length of the thin film transistor in at least one of the second protection circuit and the third protection circuit. With this configuration, currents flow less easily in the first protection circuit than in the second protection circuit and the third protection circuit. Accordingly, leakage currents of the thin film transistor in the first protection circuit are less likely to affect the readout of the charges accumulated in the pixel by the photoelectric conversion element.

In the first configuration, the at least one nonlinear element may include a thin film transistor, and a channel width of the thin film transistor in the first protection circuit may be narrower than a channel width of the thin film transistor in at least one of the second protection circuit and the third protection circuit. (third configuration).

According to the third configuration, the channel width of the thin film transistor in the first protection circuit is narrower than the channel width of the thin film transistor in at least one of the second protection circuit and the third protection circuit. With this configuration, currents flow less easily in the first protection circuit than in the second protection circuit and the third protection circuit. Accordingly, leakage currents of the thin film transistor in the first protection circuit are less likely to affect the readout of the charges accumulated in the pixel by the photoelectric conversion element.

In the second or third configuration, the thin film transistor in the first protection circuit may be constituted using an oxide semiconductor (fourth configuration).

Thin film transistors constituted using an oxide semiconductor cause smaller leakage currents than thin film transistors constituted using amorphous silicon. According to the fourth configuration, the thin film transistor in the first protection circuit is constituted using an oxide semiconductor. With this configuration, leakage currents of the nonlinear element of the first protection circuit are less likely to flow into the data lines, and charges accumulated by the photoelectric conversion element thus can be read out properly.

In the second or third configuration, the thin film transistor in the first protection circuit may include a semiconductor layer made of polycrystal low-temperature poly-silicon (fifth configuration).

Thin film transistors including a semiconductor layer made of polycrystal low-temperature poly-silicon cause smaller leakage currents than thin film transistors constituted using amorphous silicon. According to the fifth configuration, the thin film transistor in the first protection circuit is constituted using a polycrystal low-temperature poly-silicon. With this configuration, leakage currents of the nonlinear element of the first protection circuit are less likely to flow into the data lines, and charges accumulated by the photoelectric conversion element thus can be read out properly.

In the fifth configuration, the first protection circuit may include a first thin film transistor having a semiconductor layer of a first conductivity type and a second thin film transistor having a semiconductor layer of a second conductivity type opposite to the first conductivity type (sixth configuration).

According to the sixth configuration, the first protection circuit includes the first and second thin film transistors having the semiconductor layers whose conductivity types are opposite to each other, and the first thin film transistor and the second thin film transistor are each constituted using a polycrystal low-temperature poly-silicon. Accordingly, the resistance of the first protection circuit can be increased by adjusting the amount of a dopant in the first thin film transistor and the second thin film transistor.

In the first configuration, the photoelectric conversion element and a nonlinear element in the first protection circuit each may be constituted using a photodiode (seventh configuration).

According to the seventh configuration, the photoelectric conversion element and the first protection circuit can be produced in the same step. Thus, as compared with the case where the first protection circuit is constituted using a material different from that of the photoelectric conversion element, the number of production steps can be reduced.

In any of the second to sixth configurations, the active matrix substrate may be configured such that it further includes a common line to which a predetermined reference voltage lower than an electric potential of the data lines is supplied, the first protection circuit includes one thin film transistor connected to the common line, and the thin film transistor of the first protection circuit has a gate and a drain each connected to the common line and a source connected to the data lines, the second protection circuit includes a pair of thin film transistors connected to the common line and connected in parallel with each other, one of the pair of thin film transistors has a gate and a source each connected to the gate lines and a drain connected to the common line, and the other thin film transistor has a gate and a drain each connected to the common line and a source connected to the gate lines (eighth configuration).

According to the eighth configuration, the thin film transistor in the first protection circuit has the gate and the drain each connected to the common line having a lower electric potential than the data lines and a source connected to the data lines. Accordingly, when a voltage is applied to the data lines, the p-n junction of the thin film transistor of the first protection circuit is reverse-biased. Since the thin film transistor in the first protection circuit has a higher resistance than the thin film transistor in the second protection circuit, even if a leakage current of the thin film transistor in the first protection circuit is caused, the leakage current is less likely to flow into the data lines as compared with the case where the first protection circuit uses a thin film transistor equivalent to the thin film transistor in the second protection circuit. Furthermore, the second protection circuit includes a thin film transistor having a gate and a source each connected to the gate lines and a drain connected to the common line and a thin film transistor having a gate and a drain each connected to the common line and a source connected to the gate lines. Accordingly, depending on the electric potential of the gate line, the p-n junction of one of the thin film transistors in the second protection circuit is in a forward-biased state, and the p-n junction of the other thin film transistor is in a reverse-biased state. Therefore, even when positive or negative static electricity enters the gate lines, the static electricity can be released to the common line through either one of the thin film transistors.

In any of the second to sixth configurations, the active matrix substrate may be configured such that it further includes a common line to which a predetermined reference voltage lower than an electric potential of the data lines is supplied, the first protection circuit, the second protection circuit, and the third protection circuit each include a pair of thin film transistors connected to the common line and connected in parallel with each other, one of the pair of thin film transistors in the first protection circuit has a gate and a source each connected to the data lines and a drain connected to the common line, and the other thin film transistor has a gate and a drain each connected to the common line and a source connected to the data lines, one of the pair of thin film transistors in the second protection circuit has a gate and a source each connected to the gate lines and a drain connected to the common line, and the other thin film transistor has a gate and a drain each connected to the common line and a source connected to the gate lines, and one of the pair of thin film transistors in the third protection circuit has a gate and a source each connected to the bias line and a drain connected to the common line, and the other thin film transistor has a gate and a drain each connected to the common line and a source connected to the bias line. (ninth configuration).

According to the ninth configuration, the pair of thin film transistors in each of the first protection circuit, the second protection circuit, and the third protection circuit are connected to the common line having a lower electric potential than the data lines. One of the pair of thin film transistors in each of the first protection circuit, the second protection circuit, and the third protection circuit has a gate and a source each connected to a corresponding one of the wiring lines (the gate lines, the data lines, or the bias line). The other one of the pair of thin film transistors has a gate and a drain each connected to the common line. Accordingly, out of the pair of thin film transistors in each of the first protection circuit, the second protection circuit, and the third protection circuit, the p-n junction of one thin film transistor is in a reverse-biased state and the other thin film transistor is in a forward-biased state depending on the electric potential of the wiring lines to which they are connected (the data lines, the gate lines, or the bias line). Even if positive or negative static electricity enters the wiring lines such as the gate lines, the data lines, and the bias line during the production process etc. of the active matrix substrate, the static electricity can be released to the common line via one of the pair of thin film transistors in each of the first protection circuit, the second protection circuit, and the third protection circuit or can be canceled out by a charge from the common line. Accordingly, the elements on the active matrix substrate can be protected from the static electricity. Moreover, since the pair of thin film transistors in the first protection circuit have a higher resistance than the pair of thin film transistors in at least one of the other protection circuits, leakage currents of the first protection circuit are less likely to flow into the data lines. Accordingly, charges accumulated by the photoelectric conversion element can be read out properly through the data line.

In any of the second to sixth configurations, the active matrix substrate may be configured such that it further includes a first common line and a second common line that are not electrically connected to each other and to each of which the predetermined reference voltage is applied, the first protection circuit, the second protection circuit, and the third protection circuit each include a pair of thin film transistors connected in parallel with each other, one of the pair of thin film transistors in the first protection circuit has a gate and a source each connected to the data lines and a drain connected to the first common line, and the other thin film transistor has a gate and a drain each connected the first common line and a source connected to the data lines, one of the pair of thin film transistors in the second protection circuit has a gate and a source each connected to the gate lines and a drain connected to the second common line, and the other thin film transistor has a gate and a drain each connected the second common line and a source connected to the gate lines, and one of the pair of thin film transistors in the third protection circuit has a gate and a source each connected to the bias line and a drain connected to the second common line, and the other thin film transistor has a gate and a drain each connected the second common line and a source connected to the bias line (tenth configuration).

According to the tenth configuration, the pair of thin film transistors in the first protection circuit is connected to the first common line having a lower electric potential than the data lines, and the second protection circuit and the third protection circuit are connected to the second common line having a lower electric potential than the data lines. The first common line and the second common line are not electrically connected to each other. Out of the pair of thin film transistors in each of the first protection circuit, the second protection circuit, and the third protection circuit, the p-n junction of one thin film transistor is in a reverse-biased state and the other thin film transistor is in a forward-biased state depending on the electric potential of the wiring lines to which they are connected (the data lines, the gate lines, or the bias line). With this configuration, even if positive or negative static electricity enters the wiring lines such as the gate lines, the data lines, and the bias line during the production process etc. of the active matrix substrate, the static electricity can be released to the common line via one of the pair of thin film transistors in each of the first protection circuit, the second protection circuit, and the third protection circuit or can be canceled out by a charge from the common line. Accordingly, the elements on the active matrix substrate is protected from the static electricity. Moreover, since the first protection circuit, the second protection circuit, and the third protection circuit are connected to the separate common lines, leakage currents of the non-linear elements in the second and third protection circuits are prevented from flowing into the data lines as compared with the case where all the protection circuits are connected to the same common line. Accordingly, charges accumulated by the photoelectric conversion element can be read out more accurately through the data lines.

A photoelectric imaging panel includes an active matrix substrate with any of the first to tenth configurations and a scintillator for converting X-rays incident thereon to scintillation light, arranged on one surface side of the active matrix substrate (eleventh configuration).

According to the eleventh configuration, leakage currents of the nonlinear element in the first protection circuit in the active matrix substrate are less likely to flow into the data lines. Accordingly, charges corresponding to fluorescence obtained by converting the X-rays with the scintillator can be read out through the data lines without being affected by the leakage currents.

LIST OF REFERENCE NUMERALS

1: Active matrix substrate
10: Data line
11: Gate line
13: Bias line
15a, 15b: Terminal section
16a, 16b: Protection circuit section
17, 17a, 17b: Common line
18: Common terminal (GND)
21: TFT
22: Photoelectric conversion element
151: Data terminal
152: Bias terminal
153: Gate terminal
160, 160b, 160d, 160g, 260, 260b, 260d, 260g, 360: Protection circuit
1611, 1612, 1631a, 1631b, 1632a, 1632b: TFT (nonlinear element)
1621, 1622: Diode

What is claimed is:

1. An active matrix substrate comprising:
   gate lines;
   data lines that cross the gate lines;
   a photoelectric conversion element provided in a pixel bounded by the gate lines and the data lines, the photoelectric conversion element being electrically connected to a corresponding one of the data lines;
   a bias line that is connected to the photoelectric conversion element and supplies a bias voltage to the photoelectric conversion element;
   a first protection circuit connected to the data lines;
   a second protection circuit connected to the gate lines; and
   a third protection circuit connected to the bias line,
   wherein the first protection circuit, the second protection circuit, and the third protection circuit each include at least one thin film transistor,
   the active matrix further comprises one or more common lines to which a predetermined reference voltage lower than an electric potential of the data lines is supplied,
   the one or more common lines are provided separately from the bias line,
   the at least one thin film transistor in the first protection circuit has a gate and a drain each connected to one of the one or more common lines and a source connected to the data lines,
   the at least one thin film transistor in the second protection circuit has a gate and a drain each connected to one of the one or more common lines and a source connected to the gate lines,
   the at least one thin film transistor in the third protection circuit has a gate and a drain each connected to one of the one or more common lines and a source connected to the bias lines,
   the at least one thin film transistor in the first protection circuit has a higher resistance than the at least one thin film transistor of the second protection circuit, and
   the at least one thin film transistor in the first protection circuit has a higher resistance than the at least one thin film transistor of the third protection circuit.

2. The active matrix substrate according to claim 1, wherein
   a channel length of the thin film transistor in the first protection circuit is longer than a channel length of the thin film transistor in at least one of the second protection circuit and the third protection circuit.

3. The active matrix substrate according to claim 1, wherein
   a channel width of the thin film transistor in the first protection circuit is narrower than a channel width of the thin film transistor in at least one of the second protection circuit and the third protection circuit.

4. The active matrix substrate according to claim 2, wherein the thin film transistor in the first protection circuit is constituted using an oxide semiconductor.

5. The active matrix substrate according to claim 2, wherein the thin film transistor in the first protection circuit includes a semiconductor layer made of polycrystal low-temperature poly-silicon.

6. The active matrix substrate according to claim 4, wherein the first protection circuit includes a first thin film transistor having a semiconductor layer of a first conductivity type and a second thin film transistor having a semiconductor layer of a second conductivity type opposite to the first conductivity type.

7. An active matrix substrate comprising:
gate lines;
data lines that cross the gate lines;
a photoelectric conversion element provided in a pixel bounded by the gate lines and the data lines, the photoelectric conversion element being electrically connected to a corresponding one of the data lines;
a bias line that is connected to the photoelectric conversion element and supplies a bias voltage to the photoelectric conversion element;
a first protection circuit connected to the data lines;
a second protection circuit connected to the gate lines; and
a third protection circuit connected to the bias line,
wherein each of the photoelectric conversion element, the first protection circuit, the second protection circuit, and the third protection circuit includes at least one photodiode,
the active matrix further comprises one or more common lines to which a predetermined reference voltage lower than an electric potential of the data lines is supplied,
the one or more common lines are provided separately from the bias line,
the at least one photodiode in the first protection circuit has one of an anode and a cathode connected to one of the one or more common lines and the other connected to the data lines,
the at least one photodiode in the second protection circuit has one of an anode and a cathode connected to one of the one or more common lines and the other connected to the gate lines,
the at least one photodiode in the third protection circuit has one of an anode and a cathode connected to one of the one or more common lines and the other connected to the bias lines,
the at least one photodiode in the first protection circuit has a higher resistance than the at least one photodiode of the second protection circuit, and
the at least one photodiode in the first protection circuit has a higher resistance than the at least one photodiode of the third protection circuit.

8. The active matrix substrate according to claim 2, wherein the first protection circuit includes one thin film transistor connected to one of the one or more common lines, and the thin film transistor of the first protection circuit has a gate and a drain each connected to one of the one or more common lines and a source connected to the data lines, and
the second protection circuit includes a pair of thin film transistors connected to one of the one or more common lines and connected in parallel with each other, one of the pair of thin film transistors has a gate and a source each connected to the gate lines and a drain connected to one of the one or more common lines, and the other thin film transistor has a gate and a drain each connected to one of the one or more common lines and a source connected to the gate lines.

9. The active matrix substrate according to claim 2, wherein the first protection circuit, the second protection circuit, and the third protection circuit each include a pair of thin film transistors connected to one of the one or more common lines and connected in parallel with each other,
one of the pair of thin film transistors in the first protection circuit has a gate and a source each connected to the data lines and a drain connected to one of the one or more common lines, and the other thin film transistor has a gate and a drain each connected to one of the one or more common lines and a source connected to the data lines,
one of the pair of thin film transistors in the second protection circuit has a gate and a source each connected to the gate lines and a drain connected to one of the one or more common lines, and the other thin film transistor has a gate and a drain each connected to one of the one or more common lines and a source connected to the gate lines, and
one of the pair of thin film transistors in the third protection circuit has a gate and a source each connected to the bias line and a drain connected to one of the one or more common lines, and the other thin film transistor has a gate and a drain each connected to one of the one or more common lines and a source connected to the bias line.

10. The active matrix substrate according to claim 2, wherein the one or more common lines include a first common line and a second common line that are not electrically connected to each other and to each of which a predetermined reference voltage is applied,
the first protection circuit, the second protection circuit, and the third protection circuit each include a pair of thin film transistors connected in parallel with each other,
one of the pair of thin film transistors in the first protection circuit has a gate and a source each connected to the data lines and a drain connected to the first common line, and the other thin film transistor has a gate and a drain each connected to the first common line and a source connected to the data lines,
one of the pair of thin film transistors in the second protection circuit has a gate and a source each connected to the gate lines and a drain connected to the second common line, and the other thin film transistor has a gate and a drain each connected the second common line and a source connected to the gate lines, and
one of the pair of thin film transistors in the third protection circuit has a gate and a source each connected to the bias line and a drain connected to the second common line, and the other thin film transistor has a gate and a drain each connected the second common line and a source connected to the bias line.

11. A photoelectric imaging panel comprising:
the active matrix substrate according to claim 1; and
a scintillator for converting X-rays incident thereon to scintillation light, the scintillator being arranged on one surface side of the active matrix substrate.

* * * * *